United States Patent [19]

Granger-Jones

[11] Patent Number: 5,612,976
[45] Date of Patent: Mar. 18, 1997

[54] DETECTORS

[75] Inventor: Marcus R. Granger-Jones, Swindon, United Kingdom

[73] Assignee: Plessey Semiconductors, Limited, United Kingdom

[21] Appl. No.: 272,839

[22] Filed: Jul. 11, 1994

[30] Foreign Application Priority Data

Jul. 16, 1993 [GB] United Kingdom .................. 9314841

[51] Int. Cl.$^6$ ........................................ H03D 3/00
[52] U.S. Cl. ...................... 375/322; 375/326; 375/334; 375/344; 327/43; 329/302; 329/303
[58] Field of Search ...................... 375/322, 324, 375/326, 327, 329, 334, 337, 339, 344; 329/300, 302, 304, 306, 307, 323, 325, 336; 327/3, 40–47, 2, 39, 238, 254, 255; 455/192.2, 196.1, 208, 255, 260, 263, 264, 265

[56] References Cited

U.S. PATENT DOCUMENTS 5,042,052  8/1991  Roberts et al. ........................ 375/344
5,249,204  9/1993  Funderburk et al. .................. 375/326
5,301,210  4/1994  Vandamme et al. .................... 375/329
5,438,594  8/1995  Podolak ................................ 375/327

FOREIGN PATENT DOCUMENTS 2180419  3/1987  United Kingdom .

*Primary Examiner*—Stephen Chin
*Assistant Examiner*—Amanda T. Le
*Attorney, Agent, or Firm*—Kirschstein, et al.

[57] ABSTRACT

A direct conversion Binary FSK radio receiver has an AFC loop comprising an Exclusive-Or phase detector 104 responsive to the $I_3$ and $Q_3$ signals. I and Q filters 100, 101 are not identical but have different frequency-phase characteristics such that their phase shifts are identical when the local oscillator 102 is correctly tuned and differ when the local oscillator is off-tune. Detector 104 detects the change of phase and applies a control signal to local oscillator 102 such as to return the local oscillator frequency to the correct value. Alternatively, identical filters may be used in the I and Q channels, circuits having different phase shifts being coupled between the $I_3$ and $Q_3$ signals and the inputs of the phase detector 104.

17 Claims, 7 Drawing Sheets

Fig. 11  I AND Q FILTERS
I CHANNEL.
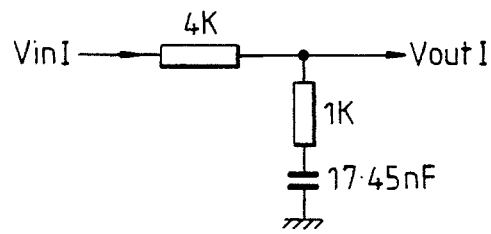
Q CHANNEL.
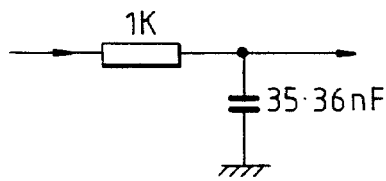
Fig. 12
DIFFERENTIAL PHASE RESPONSE OF I AND Q FILTERS VPI-VPQ VERSUS FREQUENCY
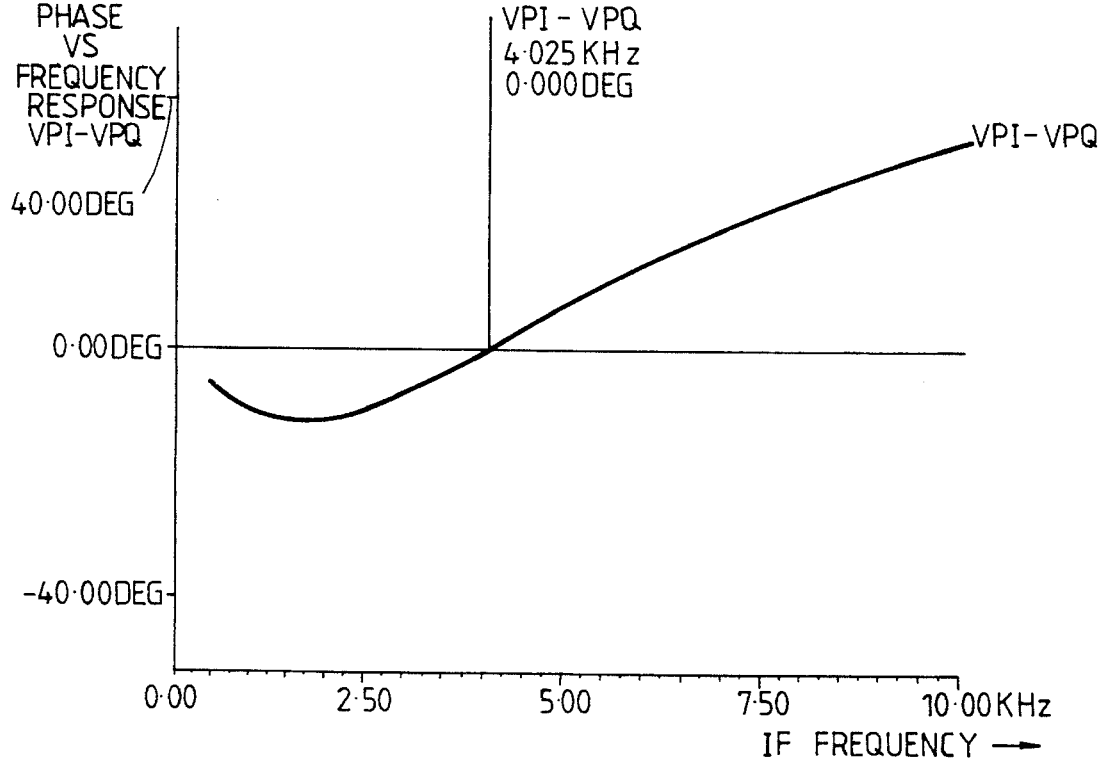

DETECTORS

BACKGROUND OF THE INVENTION

This invention relates to detectors. More particularly, but not exclusively, this invention relates to direct conversion Quadrature Detectors for use in demodulating FSK modulated radio signals, and to radio receivers incorporating such detectors.

In a conventional zero IF FSK Receiver, shown in FIG. 1, an incoming radio signal on Node 1 is applied to two channels, an in-phase channel I, and a Quadrature-phase channel Q. Both channels are substantially identical and comprise a respective mixer 2, 3, channel filter 4, 5, and a limiting amplifiers 6, 7. A local oscillator 8 is applied directly to the in-phase mixer 2 and via 90° phase shift circuit 9 to the Quadrature-Phase mixer 3. The limiting amplifiers 6, 7 remove the amplitude information from the signals and produce digital output signals containing only phase information. These signals are applied to a detector 10. The output of detector 10 is passed through limiting amplifier 11 to produce a detected base-band signal at its output 12. If necessary, amplifier 11 may incorporate a post-detection filter, not shown. Channel filters 4 and 5 serve to reject unwanted spurious signals from the output 5 of the mixers, and both I and Q channels are ideally identical so as to avoid any additional phase shift. The two signals applied to the inputs of detector 10 therefore always lead or lag each other by 90°.

Such prior art circuits have proved satisfactory, but require the use of a highly stable local oscillator LO locked to the carrier frequency of the signal to be received. In practice this means the use of a high quality and relatively expensive crystal oscillator. Such a crystal oscillator can represent a significant part of the expense of a receiver especially in applications such as paging systems.

One way of avoiding the requirement to use a highly stable crystal is to use an AFC (Automatic Frequency Control) loop which locks itself to the carrier of the received signal. The absence of an intermediate frequency signal in direct conversion receivers poses difficulties in the use of an AFC loop for frequency control. The present invention arose from an attempt to provide an improved receiver.

SUMMARY OF THE INVENTION

In accordance with the invention, a frequency detector comprises a first node arranged to receive a first signal which is a function of the input signal, a second node arranged to receive a second signal which is a function of the input signal, third and fourth nodes, phase shift means arranged to couple the first and second nodes to the third and fourth nodes respectively and to provide a first phase shift between the first and third nodes and a second phase shift between the second and fourth nodes, the phase shift means being such that the difference between the first and second phase shifts varies as a function of frequency, and phase detector means coupled to the third and fourth nodes and arranged to produce an output signal which is a function of the said difference, whereby said output signal is a function of the frequency of the input signal.

BRIEF DESCRIPTION OF THE DRAWINGS

The invention will now described by a non-limiting example only with a reference to the drawings in which

FIG. 11 shows examples of filters suitable for use with the embodiment of FIG. 2;

FIG. 12 is a graph illustrating the differential phase response of the filters of FIG. 10;

DETAILED DESCRIPTION OF THE PREFERRED EMBODIMENT

Figure 1:
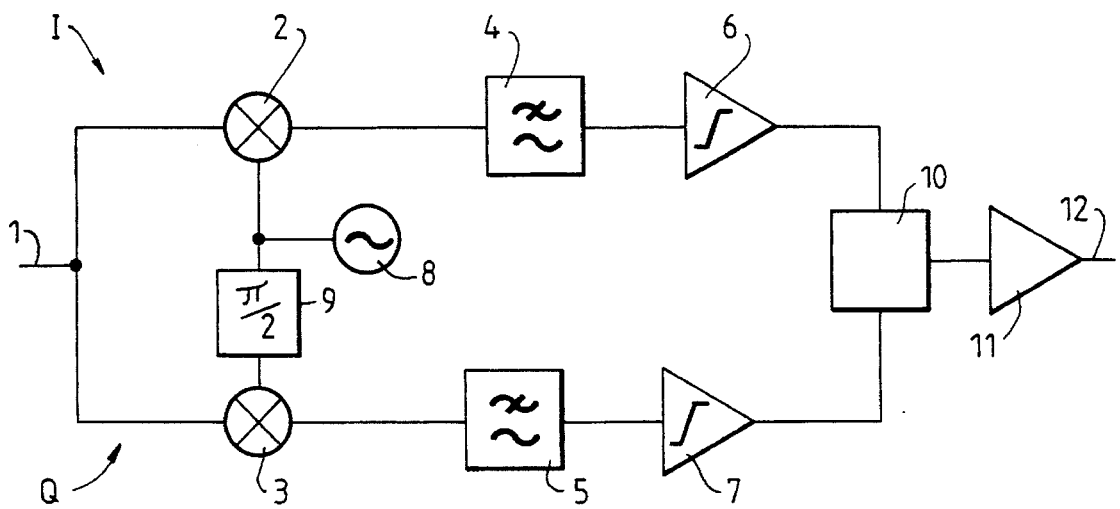
FIG. 1 shows prior art radio receiver.
Figure 2:
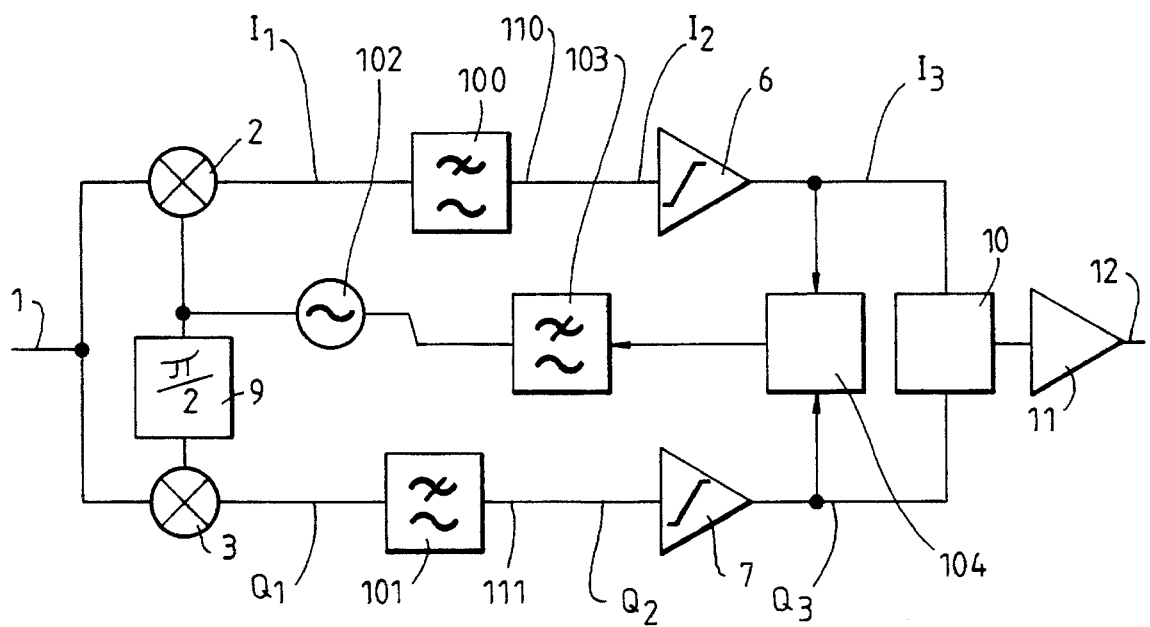
FIG. 2 shows a first embodiment of the invention.
Figure 6:
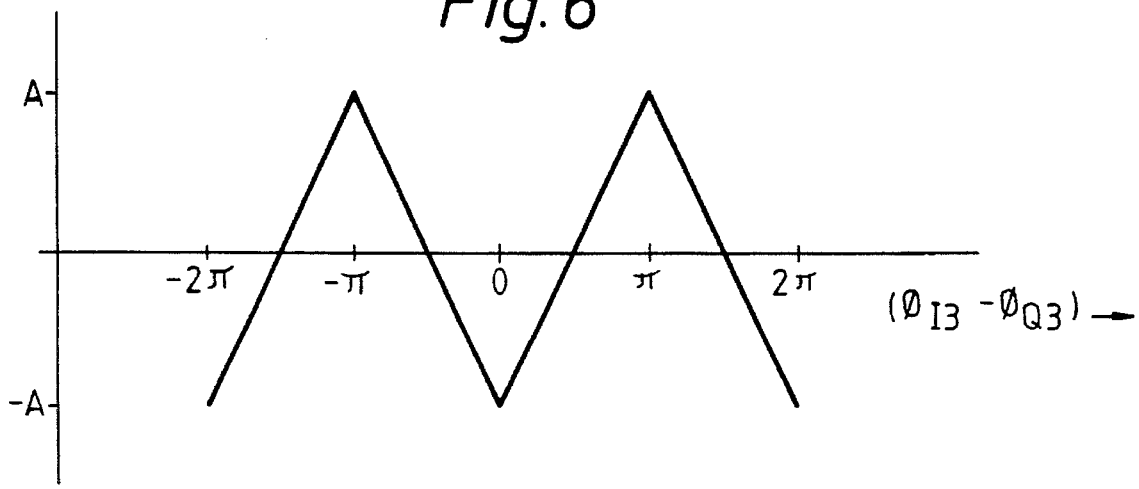

In FIG. 2 a detector in accordance with the invention is used to provide a zero IF FSK radio receiver having automatic frequency control. As with FIG. 1, the receiver has I and Q channels. The mixers 2, 3, limiting amplifiers 6, 7, and phase shift circuit 9, detector 10 and the amplifier 11 are substantially identical with correspondingly-numbered items in FIG. 1. Detector 104 comprises an Exclusive-Or (EX-OR) gate. Filter 103 removes the AC component from the output on 104 and applies the DC component of the EX-OR output signal to VCO 102 which constitutes the local oscillator of the receiver. Unlike filters 4 and 5 of FIG. 1, filters 100 and 101 of FIG. 2 are not identical with each other but are specifically designed to have mutually different frequency-phase characteristics. The characteristics are such that, when oscillator 102 is at the correct frequency for receiving the incoming FSK signal at node 1, the signals at their respective outputs 110, 111 are exactly in quadrature. If the local oscillator frequency is too high, then 110 will differ from 111 by more than 90° for logic "1" and less than −90° for logic "0" and if too low, then 110 will differ from 111 by less than 90° for logic "1" and more than −90° for logic "0". This variation in phase difference with frequency is utilised to control the frequency of the local oscillator. The phase difference is detected by detector 104 whose mean DC output voltage varies as a function of the phase difference. As the phase difference tends towards zero, the mean DC component decreases, while as the phase difference approaches 180° the DC component increases. This variation is illustrated in FIG. 6. In the present embodiment, the detector 104 is provided with a push-pull output stage which, in known manner, provides either pump-up or pump-down pulses which respectively incrementally tend to increase or decrease the DC voltage applied to a voltage-responsive element in VCO 102, the voltage being increased if the pump-up pulses predominate over the pump-down pulses, and decreased if the pump-down pulses predominate. The value +A implies 100% pump-up pulses, −A implies 100% pump-down pulses, while zero implies that the energy supplied by pump-up pulses is equal to that removed by the pump-down pulses, which situation obtains when $I_3$ and $Q_3$ are substantially in quadrature. When the VCO is correctly tuned to the carrier frequency, $I_3$ and $Q_3$ will be in quadrature for both possible values of binary data, $I_3$ leading $Q_3$ for one logic state and lagging for the other. Thus, irrespective of the value of data being received, the DC output of detector 104 will be zero.

If the local oscillator frequency is too high, then the signals at output 110, 111 will, because of the effects of 100, 101, no longer be in quadrature but, as noted above, will deviate from quadrature by an amount which is a function of the discrepancy between the actual local oscillator frequency and its correct value. This deviation from quadrature will upset the balance between the pump-up and pump-down pulses, thereby causing a change in the DC output component of the EX-OR detector 104 in such a sense as to tend to return the output frequency of local oscillator 102 to its proper value.

A conventional Zero IF FSK receiver, such as that illustrated in FIG. 1, has the property that if the instantaneous frequency of the incoming RF signal, $F_{sig}$, is greater than the LO frequency, $F_{lo}$, then the I channel leads the Q channel by 90 degrees. If $F_{sig}$ is less than $F_{lo}$ then the I channel lags the Q channel by 90 degrees. This property is illustrated graphically in FIG. 3. One way of demodulating the incoming signal is to determine which channel leads which by 90°.

The AFC circuit function of FIG. 2 is achieved by generating a VCO control signal which is obtained by deliberately mismatching the phase versus frequency response of the two filters 100 and 101. If the input signals to 100 and 101 are $I_1$ and $Q_1$ respectively, and the signals at the outputs of 100 and 101 are $I_2$ and $Q_2$ respectively, then the phase shifts across 100 and 101 are given by $(\phi_{I1}-\phi_{I2})$ and $(\phi_{Q1}-\phi_{Q2})$ respectively. The difference $\delta\phi_{IQ}=(\phi_{I1}-\phi_{I2})-(\phi_{Q1}-\phi_{Q2})$. $\delta\phi_{IQ}$ is positive for $F_{IF}<F_{\delta F}$ and is negative for $F_{IF}>F_{\delta F}$ (or in both cases vice versa if there is a second inversion in the loop) and is zero for $F_{IF}=F_{\delta F}$ where $\delta F$ is the frequency for which the filters 100 and 101 produce the same phase shift. The exact respective characteristics of filters 100, 101 are not particularly important but for ease of explanation we shall assume a linear response as shown in the phase $\delta\phi_{IQ}$ versus frequency $F_{IF}$ plot of FIG. 4.

Figure 3:
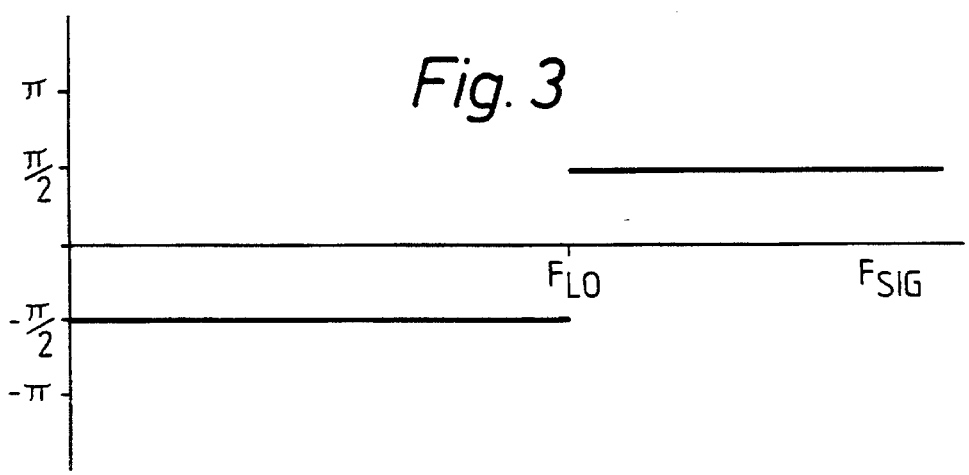
FIGS. 3 to 10 are graphs illustrating the operation of FIG. 2.
Figure 4:
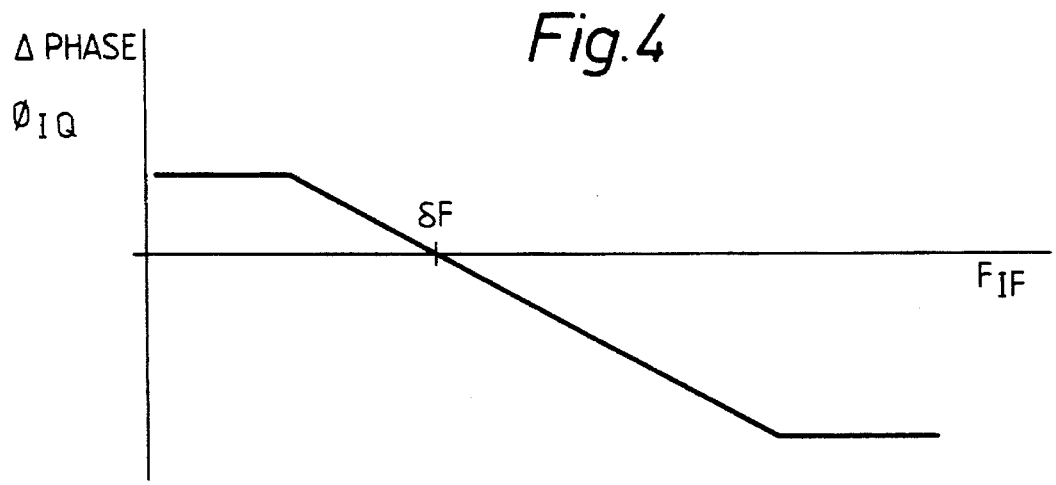

We now combine FIGS. 3 and 4. This gives FIG. 5, which shows the phase difference $(\phi_{I3}-\phi_{I3})$ versus instantaneous frequency of $F_{sig}$, of the incoming FSK RF signal.

Figure 5:
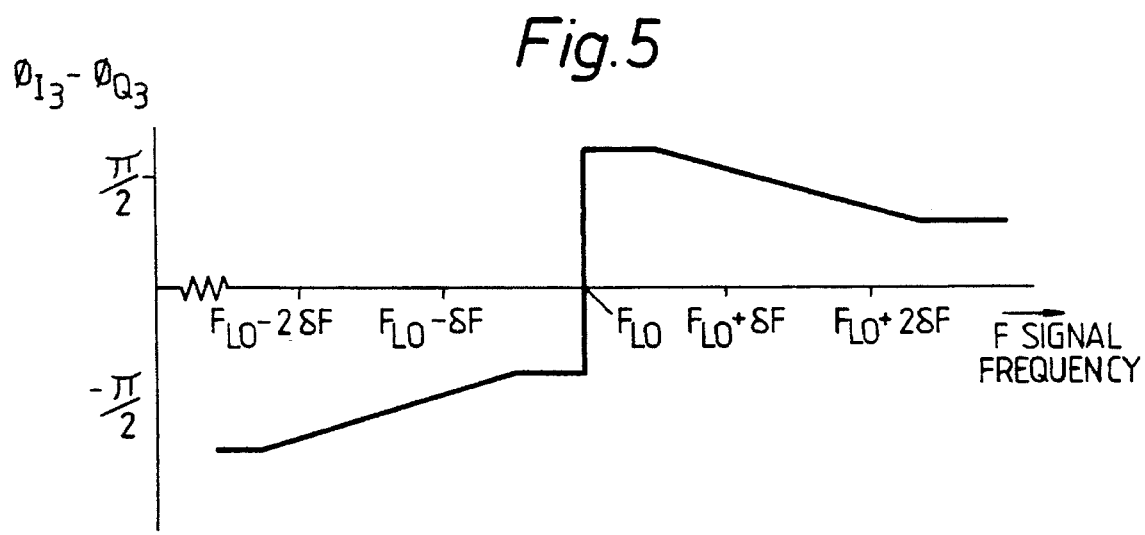
Figure 7:
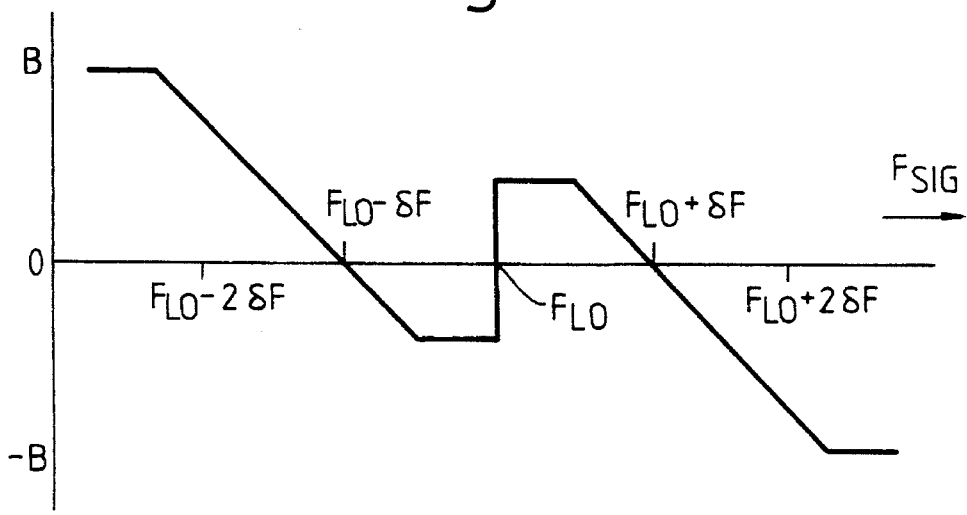

The outputs of the limiting amplifiers, signals $I_3$ and $Q_3$, provide the inputs to Exclusive-OR phase detector 104. The EX-OR's DC output voltage component versus phase difference $(\phi_{I3}-\phi_{Q3})$ is shown in FIG. 6. Combining this with the phase difference $(\phi_{I3}-\phi_{Q3})$ versus frequency characteristic of FIG. 5 gives the EX-OR phase detector's DC output voltage versus the instantaneous frequency of $F_{sig}$, of the incoming FSK RF signal. This is shown in FIG. 7.

An incoming binary FSK signal jumps between one of two instantaneous frequencies depending on the data being transmitted: $F_c+\delta F$ corresponding to a logic "one" or $F_c-\delta F$ which corresponds to a logic "zero". Under ideal receiving conditions $F_c$ is equal to $F_{lo}$. If the carrier frequency $F_c$ and LO frequencies, $F_{lo}$, are not identical ($F_c=F_{lo}+F_{err}$), we have an offset frequency, $F_{err}$. This results in an instantaneous frequency for a logic "1" of $(F_{lo}+F_{err}+\delta F)$ and for a logic "0" of $(F_{lo}+F_{err}-\delta F)$. From FIG. 7 we observe that the output from the EX-OR gate for the instantaneous frequency of a logic "1" and a logic "0" add together in the same sense for a given $F_{err}$. The EX-OR gate output is therefore always zero for $F_{err}=0$, negative for $0<F_{err}<\delta F$ and positive for $0>F_{err}>-\delta F$. The EX-OR phase detector's output, after filtering to remove the AC component, can therefore be used within a feedback loop to pull in the VCO's frequency, $F_{lo}$, and reduce $F_{err}$.

For simplicity, the invention has been described in terms of the instantaneous frequency, $F_{sig}$, as being either at $F_c+\delta F$ (i.e. logic 1) or $F_c-\delta F$ (i.e. logic zero). The output of detector 104 in the transient case with an incoming signal being modulated by a random data stream can be approximated as a time-average of the detector's output for each of the instantaneous frequencies. This approximation is accurate for wideband FSK and still holds at low modulation indices.

Figure 8:
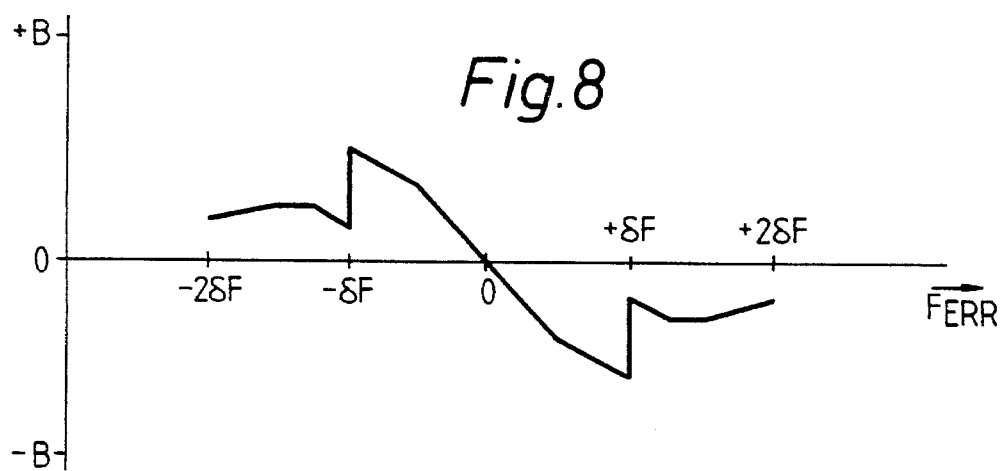
Figure 9:
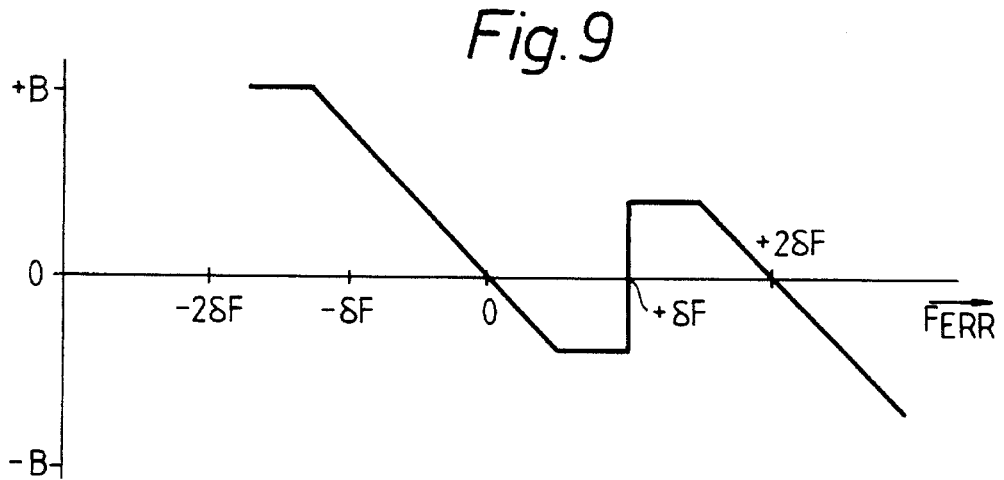
Figure 10:
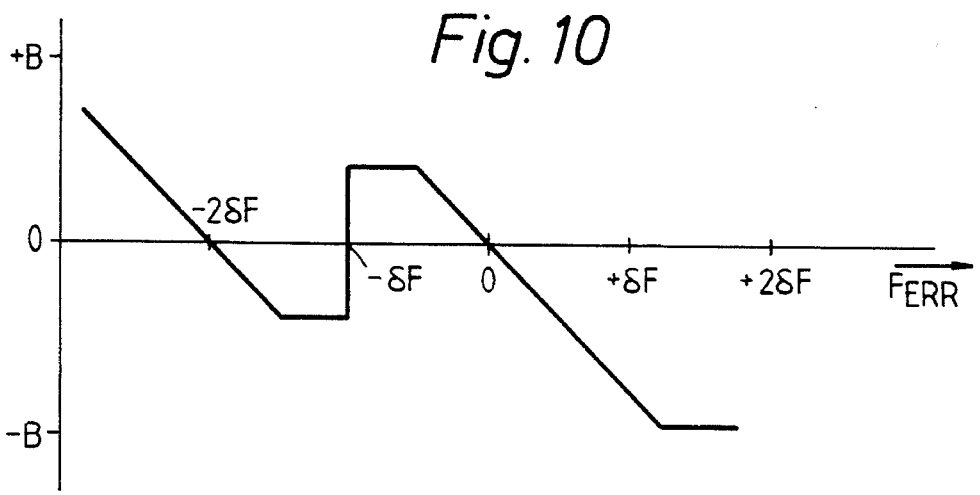

The respective average open loop characteristics of the DC component for the EX-OR phase detector's output for 010101, 000000 and 111111 data streams plotted against $F_{err}$ are shown in FIGS. 8, 9 and 10 respectively. In FIGS. 8, 9 and 10, zero $F_{err}$ corresponds to the carrier frequency $F_c$. In FIG. 8, $F_{sig}$ toggles between $F_c+\delta F$ and $F_c-\delta F$. In FIG. 9, $F_{sig}=F_c-\delta F$. In FIG. 10, $F_{sig}=F_c+\delta F$. It can be seen in all cases that the EX-OR's output, after filtering, provides a negative feedback signal that corrects for small $F_{err}$ ($<|\delta F|$) and tries to keep the VCO frequency at $F_c$. It can also be seen that the characteristic for the 010101 state shown in FIG. 8 is the average of the characteristics shown in FIGS. 9 and 10.

For the case when the modulus of $F_{err}$ is greater than $\delta F$, the capture range of the AFC system is code-dependent. For certain combinations of $F_{err}$ and codes (eg FIG. 9, $F_{err}=+1.5\delta F$, code=000000) it is possible to get an inversion in the loop resulting in the feedback increasing $F_{err}$ rather than reducing it. In paging coding systems there is a period of 01010101 preamble before data is transmitted. In FIG. 8 we observe that, for such a code, for all $F_{err}$ we always get negative feedback, hence provided we achieve capture within this preamble period we have extended the capture range. Within the range $\delta F<F_{err}<-\delta F$ the feedback is always negative, hence once $F_{err}$ is within this range the $AF_c$ system should achieve capture.

FIG. 11 shows an example of filter circuits suitable for inclusion in the I and Q channel filters 100, 101 to provide the required differential phase characteristics. The differential phase characteristics of the filters of FIG. 11 are shown in FIG. 12. It is to be noted that, while the filters of FIG. 11 per se are capable of providing satisfactory performance in respect of frequency control feedback, they may provide insufficient rejection for the data detector circuit 10. Accordingly the filters of FIG. 11 are preferably coupled in series with conventional matched filters, not shown separately, which are included in filters 100, 101 of FIG. 2.

Figure 13:
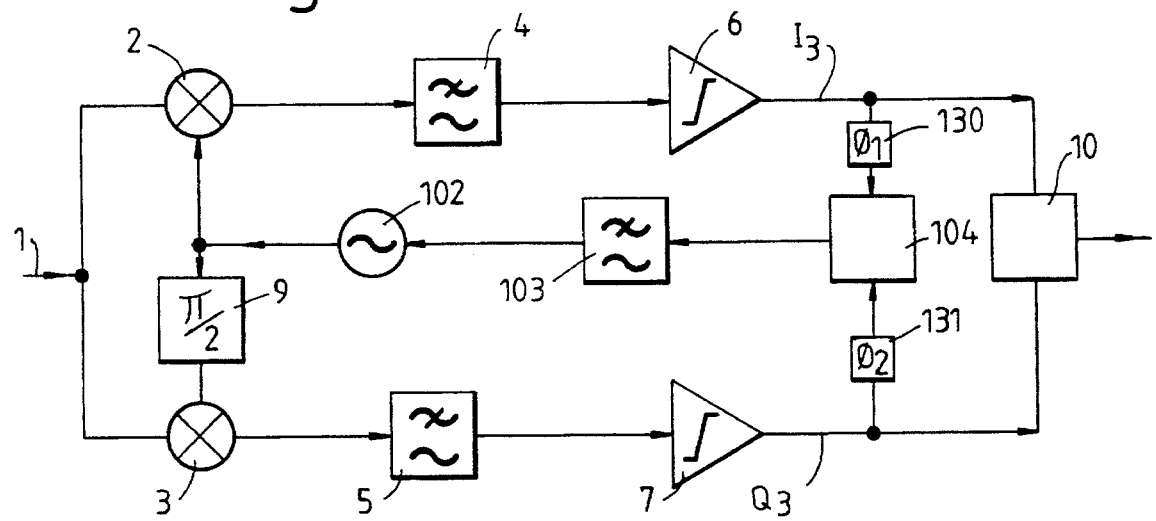
FIG. 13 shows a second embodiment of the invention.

In the second embodiment of the invention shown in FIG. 13, filters 4 and 5 are identical with the corresponding filters of FIG. 1. The phase imbalance between the signals applied to the EX-OR detector 104 is provided by respective phase shift circuits 130, 131 coupled between the outputs of limiting amplifiers 6, 7 and the inputs of detector 104. This arrangement has the advantage that the outputs of signals 6 and 7 are maintained orthogonal at all times, ensuring that detector 10 is always provided with orthogonal signals. Operation is otherwise identical with FIG. 2.

In a modification, one or the other of 130, 131 may be dispensed with, the necessary frequency-phase characteristic being provided by a single circuit 130, 131.

In another modification, not shown, further limiting amplifiers are disposed between filters 130, 131 and detector 104 to ensure that 104 is provided with logic signals of the correct levels.

Figure 14:
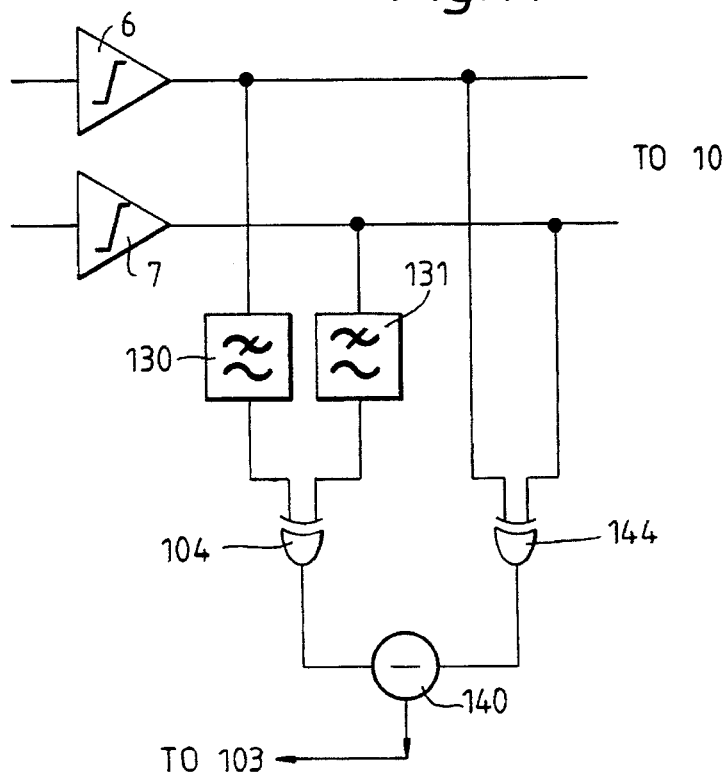
FIG. 14 shows a third embodiment of the invention.

FIG. 14 shows a third embodiment which is a modification of FIG. 13 and which can be used to overcome departures from true orthogonality in the local oscillator signals applied to mixers 2, 3. Only the relevant circuitry is shown, the rest of the circuit being as shown in FIG. 13 or FIG. 13 incorporating the unillustrated modifications referred to in the preceding paragraphs. This embodiment differs from FIG. 13 in that it has a further EX-OR gate 144 and a subtracter 140 arranged to generate the difference between the outputs of 104 and 144.

Assume that phase shift circuit 9, not shown, does not produce exactly 90° phase shift. Thus the I and Q channels will not be exactly offset by 90°. If the oscillator 102 happens to be operating at the correct frequency, the phase error induced by the phase shift error in 9 causes 104 to output a spurious error signal. Gate 144 generates a correction signal which is equal to the phase error signal component in the output of gate 104 produced by the phase shift circuit 9 per se. The correction signal is not responsive to the phase shifts produced by circuits 130, 131, and accordingly is unaffected by any error in the local oscillator frequency. By subtracting the outputs of 104 and 144, the error produced by the phase shift circuit 9 is cancelled out and thus the signal applied to 103 represents only the error in frequency.

Figure 15:
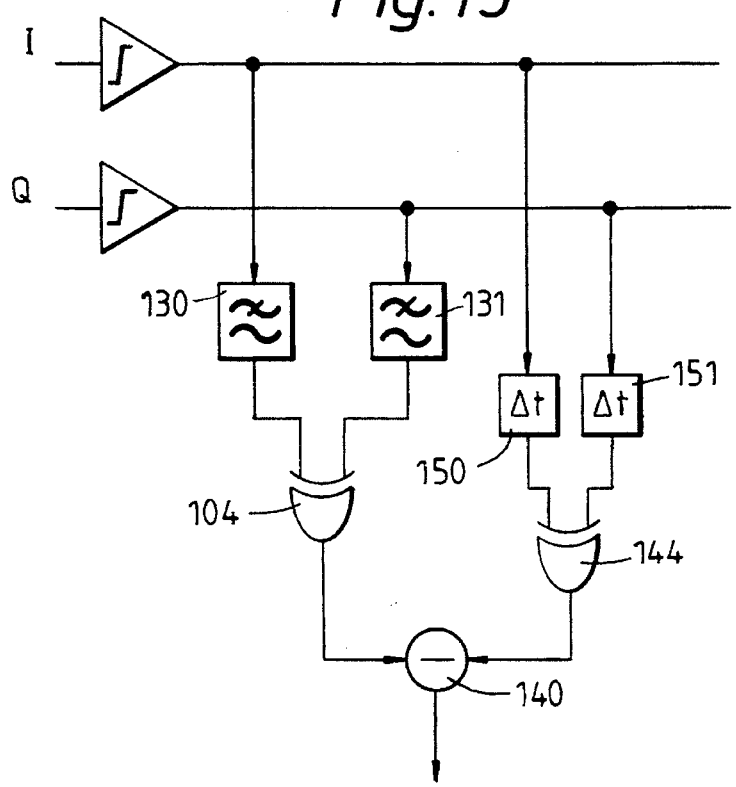
FIG. 15 shows a fourth embodiment of the invention.

FIG. 15 is a modification of FIG. 14. This embodiment of the invention differs from FIG. 14 only in the provision of delay circuits 150, 151 which delay the signals applied to the inputs of 144. Delay circuits 150, 151 are matched, providing substantially identical delays. The delay is such that, in the absence of any error in phase shift circuit 9 or local oscillator frequency, the pulsating outputs of 104 and 144 are substantially exactly in-phase and cancel out. This can reduce the amount of filtering necessary in the AFC loop. Operation is otherwise identical with that of FIG. 14.

Figure 16:
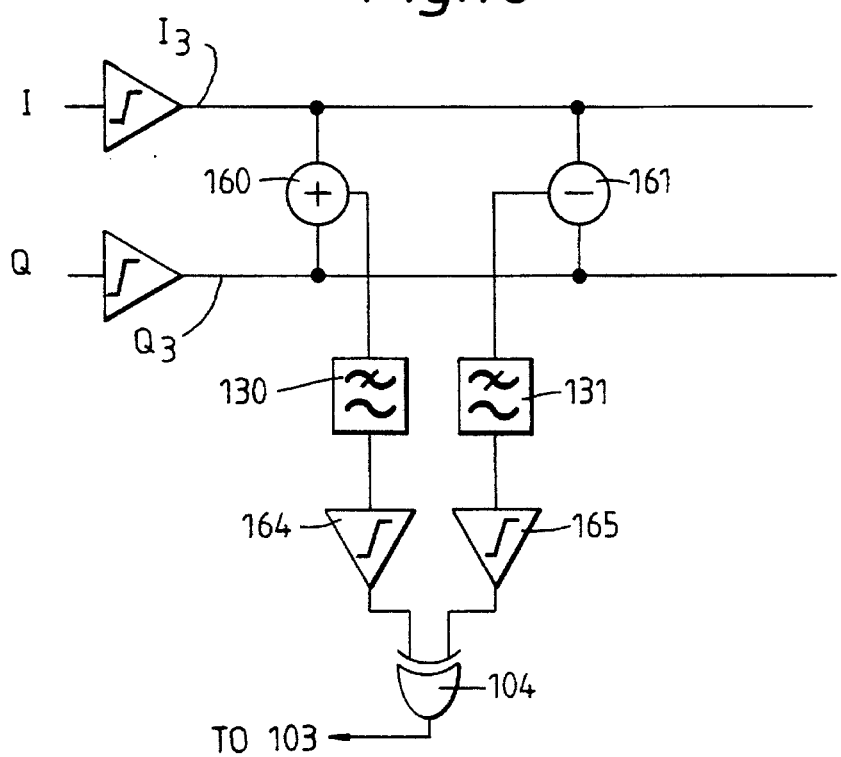
FIG. 16 shows a fifth embodiment of the invention.

The embodiment of FIG. 16 is a further modification of FIG. 13. Adder 160 sums the $I_3$ and $Q_3$ signals and applies the result to filter 130. Subtracter 161 determines the difference between $I_3$ and $Q_3$ and applies the result to filter 131. As with the previously described embodiments, filters 130 and 131 have different frequency-phase characteristics. The outputs of 130 and 131 are applied to EX-OR detector 104 via respective limiting amplifiers 164, 165. The output of detector 104 is applied to filter 103, not shown. The circuit is otherwise as shown in FIG. 13. As with FIGS. 14 and 15, the FIG. 16 embodiment has the property that the actual value of the phase shift produced by phase shift circuit 9, not shown, has no effect on the output of detector 104. Inspection of FIG. 16 indicates that, irrespective of the phase difference between the $I_3$ and $Q_3$, then, when 130 and 131 produce the same phase shift, the signals applied to the inputs of detector 104 are always orthogonal. The input signals to 104 only deviate from orthogonality when the local oscillator frequency deviates from its correct frequency, thereby causing the phase shift of 130 to differ from that of 131.

Although the invention has been described in the context of a direct conversion Binary FSK receiver, it is equally applicable to receivers having pairs of signals offset by any predetermined known phase angle.

The above embodiments are given by way of example only and a number of modifications are possible within the scope of the invention.

For example, some or all of the circuit elements, in particular filters 100, 101, may be implemented digitally. Further, although in FIG. 2 reference has been made to filters such as 101 and 102 having different phase characteristics, they could be replaced by substantially identical filters such as 4, 5 in series with all-pass circuits having mutually different phase characteristics. Similar comments apply to filters 130, 131 of FIGS. 14 to 16. Further, although reference has been made to the use of Exclusive-Or phase detectors, any other suitable phase detector may be employed.

What is claimed is:

1. A frequency detector for producing an output signal which is a function of the frequency of an input signal, comprising:

a first node for receiving a first signal which is a function of the input signal;

a second node for receiving a second signal which is a function of the input signal;

third and fourth nodes;

phase shift means for coupling the first and second nodes to the third and fourth nodes respectively, and for providing a first phase shift between the first and third nodes and a second phase shift between the second and fourth nodes;

said phase shift means being operative such that the difference between the first and second phase shifts varies as a function of frequency;

a first phase detector means having first and second inputs coupled to the third and fourth nodes and an output, said first phase detector means being operative for producing a signal at said output which is a function of said difference between the first and second phase shifts;

a further phase detector means having first and second inputs coupled to the first and second nodes and an output; and difference means having first and second inputs coupled to the outputs of the first phase detector means and the further phase detector means respectively, said difference means having an output for providing said output signal which is a function of the frequency of said input signal.

2. A frequency detector as claimed in claim 1 in which the first and second signals have a predetermined phase relationship with each other.

3. A frequency detector as claimed in claim 2 in which the first and second signals have different phases.

4. A frequency detector as claimed in claim 3 in which the first and second signals are substantially orthogonal.

5. A frequency detector as claimed in claim 1 in which the phase shift means comprises a first phase shift circuit disposed between the first and third nodes.

6. A frequency detector as claimed in claim 5 in which the phase shift means comprises a second phase shift circuit disposed between the second and fourth nodes.

7. A frequency detector as claimed in claim 1 in which the phase shift means comprises filter means.

8. A frequency detector as claimed in claim 7 in which the filter means comprises a low-pass filter.

9. A frequency detector as claimed in claim 1 in which the phase shift means comprises time delay means.

10. A frequency detector as claimed in claim 1 in which the phase detector means comprises an Exclusive-Or phase detector.

11. An automatic frequency control system comprising a frequency generator and a detector as claimed in claim 1 in which the output of the frequency generator is coupled to the detector and the output signal of the detector is used to control the output frequency of the frequency generator.

12. A radio receiver comprising an automatic frequency control system as claimed in claim 11 in which the frequency generator comprises a local oscillator of the radio receiver.

13. A radio receiver as claimed in claim 12 and arranged to receive a frequency shift keyed modulated input signal, in which the difference between the first and second phase shifts is arranged to be substantially zero at a frequency corresponding to the pulse deviation frequency of the FSK modulated signal.

14. A radio receiver as claimed in claim 13 in which the first and further phase detector means are arranged to provide an output such as to cause no change in the local oscillator frequency when the local oscillator frequency corresponds with the carrier frequency of the FSK modulated signal.

15. A radio receiver as claimed in claim 12 in which the radio receiver comprises a direct conversion quadrature receiver.

16. A frequency detector as claimed in claim 1, further comprising first and second delay means respectively coupled between the respective first and second nodes and the respective first and second inputs of the further phase detector means.

17. A frequency detector for producing an output signal which is a function of the frequency of an input signal, comprising:

first, second, third and fourth nodes;

means for generating first and second intermediate signals, each intermediate signal being a function of the input signal, the second intermediate signal being a phase-shifted version of the first intermediate signal;

sum means for applying the sum of the first and second intermediate signals to the first node;

difference means for applying the difference between the first and second intermediate signals to the second node;

phase shift means for coupling the first and second nodes to the third and fourth nodes respectively, and for providing a first phase shift between the first and third nodes and a second phase shift between the second and fourth nodes;

said phase shift means being operative such that the difference between the first and second phase shifts varies as a function of the frequency of the input signal; and phase detector means coupled to the third and fourth nodes and operative for producing an output signal which is a function of the difference between said first and second phase shifts.

* * * * *